(12) United States Patent
Fonteneau

(10) Patent No.: US 9,012,955 B2
(45) Date of Patent: Apr. 21, 2015

(54) MOS TRANSISTOR ON SOI PROTECTED AGAINST OVERVOLTAGES

(71) Applicant: STMicroelectronics SA, Montrouge (FR)

(72) Inventor: Pascal Fonteneau, Theys (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 13/921,436

(22) Filed: Jun. 19, 2013

(65) Prior Publication Data

US 2014/0015002 A1  Jan. 16, 2014

(30) Foreign Application Priority Data

Jul. 13, 2012  (FR) ..................... 12/56762

(51) Int. Cl.
*H01L 29/749* (2006.01)
*H01L 27/02* (2006.01)
*H01L 27/12* (2006.01)

(52) U.S. Cl.
CPC .......... *H01L 29/749* (2013.01); *H01L 27/0262* (2013.01); *H01L 27/0296* (2013.01); *H01L 27/1207* (2013.01); *H01L 27/1203* (2013.01)

(58) Field of Classification Search
CPC . H01L 29/7436; H01L 29/74; H01L 27/0262; H01L 27/1027; H01L 2924/00; H01L 2924/13055; H01L 2924/00014; H01L 2924/10253; H01L 29/1095
USPC .......................... 257/133, 107, 141, 347, 146
See application file for complete search history.

(56) References Cited

U.S. PATENT DOCUMENTS

| | | | |
|---|---|---|---|
| 5,923,067 A | 7/1999 | Voldman | |
| 6,071,763 A | 6/2000 | Lee | |
| 2003/0146474 A1* | 8/2003 | Ker et al. | 257/347 |
| 2006/0054892 A1 | 3/2006 | Hayashi | |
| 2009/0026542 A1 | 1/2009 | Wahl | |

* cited by examiner

*Primary Examiner* — Chuong A Luu
*Assistant Examiner* — Rodolfo Fortich
(74) *Attorney, Agent, or Firm* — Allen, Dyer, Doppelt, Milbrath & Gilchrist, P.A.

(57) ABSTRACT

A MOS transistor protected against overvoltages formed in an SOI-type semiconductor layer arranged on an insulating layer itself arranged on a semiconductor substrate including a lateral field-effect control thyristor formed in the substrate at least partly under the MOS transistor, a field-effect turn-on region of the thyristor extending under at least a portion of a main electrode of the MOS transistor and being separated therefrom by said insulating layer, the anode and the cathode of the thyristor being respectively connected to the drain and to the source of the MOS transistor, whereby the thyristor turns on in case of a positive overvoltage between the drain and the source of the MOS transistor.

10 Claims, 3 Drawing Sheets

MOS TRANSISTOR ON SOI PROTECTED
AGAINST OVERVOLTAGES

CROSS REFERENCE TO RELATED
APPLICATION

This application is a translation of and claims the priority benefit of French patent application number 12/56762, filed on Jul. 13, 2012, entitled "MOS TRANSISTOR ON SOI PROTECTED AGAINST OVERVOLTAGES," which is hereby incorporated by reference to the maximum extent allowable by law.

BACKGROUND

The present disclosure relates to the protection against overvoltages of a MOS transistor formed in a semiconductor layer of SOI ("Silicon-On-Insulator") type. The present disclosure more specifically relates to the protection of such a MOS transistor against overvoltages due to electrostatic discharges.

DISCUSSION OF THE RELATED ART

Generally, to protect a component against overvoltages, for example electrostatic discharges capable of occurring while the component is not connected, a protection device connected between the terminals where the overvoltage is capable of occurring is used. In the case of a one-way protection, this device may be an uncontrolled element such as an avalanche diode or a Shockley diode. This protection device may also be a controlled element such as a transistor or a bipolar thyristor or a field-effect-controlled thyristor.

In the case where the component to be protected is a MOS transistor formed in an SOI-type semiconductor layer of minimum dimension, the protection device is generally arranged next to the transistor to be protected, and the protection device may use a larger surface area than that taken up by the transistor.

There thus is a need for a device for protecting a MOS transistor formed in an SOI-type semiconductor layer against overvoltages, the assembly taking up a surface area little greater than that taken up by the transistor alone.

SUMMARY

An embodiment provides a MOS transistor protected against overvoltages formed in an SOI-type semiconductor layer arranged on an insulating layer, itself arranged on a semiconductor substrate comprising a lateral field-effect-controlled thyristor formed in the substrate at least partly under the MOS transistor, a field-effect turn-on region of the thyristor extending under at least a portion of a main electrode of the MOS transistor and being separated therefrom by said insulating layer, the anode and the cathode of the thyristor being respectively connected to the drain and to the source of the MOS transistor, whereby the thyristor turns on in case of a positive overvoltage between the drain and the source of the MOS transistor.

According to an embodiment, the field-effect turn-on region of the thyristor corresponds to its cathode gate region and extends under at least a portion of the drain region of the MOS transistor.

According to an embodiment, the field-effect turn-on region of the thyristor corresponds to its anode gate region and extends under at least a portion of the source region of the MOS transistor.

According to an embodiment, the MOS transistor protected against overvoltages comprises a first well of a first conductivity type and a second well of the second conductivity type extending next to each other in the upper portion of the substrate, at least partly under the MOS transistor. The MOS transistor protected against overvoltages further comprises first and second regions of the second conductivity type respectively extending at the surface of the first and second wells, the first and second regions being separated from each other by a portion of the first well corresponding to the field-effect turn-on region of the thyristor.

According to an embodiment, the first and second wells are respectively P-type and N-type doped. A cathode contact region of the thyristor corresponds to a third N-type region more heavily doped than the first region, extending at the surface of the first well next to the first region and in contact therewith. The anode region of the thyristor corresponds to a fourth heavily-doped P-type region extending at the surface of the second well next to the second region and in contact therewith.

According to an embodiment, the first and second wells are respectively P-type and N-type doped. A cathode contact region of the thyristor corresponds to a third N-type region more heavily doped than the first region, extending above the first region and in contact therewith. The anode region of the thyristor corresponds to a fourth heavily-doped P-type region extending above the second region and in contact therewith.

According to an embodiment, the substrate is P-type doped and the first and second wells are respectively N-type and P-type doped. An anode contact region of the thyristor corresponds to a third P-type region more heavily doped than the first region, extending at the surface of the first well next to the first region and in contact therewith. The cathode region of the thyristor corresponds to a fourth heavily-doped N-type region extending at the surface of the second well next to the second region and in contact therewith. An N-type buried layer extends at least under the second well.

According to an embodiment, a first terminal connected to the first well is connected to the cathode of the thyristor, and a second terminal connected to the second well is connected to the anode of the thyristor.

According to an embodiment, a first terminal connected to the first well is connected to the anode of the thyristor, and a second terminal connected to the second well is connected to the cathode of the thyristor.

According to an embodiment, the thickness of the SOI-type semiconductor layer ranges between 3 and 100 nm, and the thickness of the insulating layer ranges between 5 and 30 nm.

The foregoing and other features and benefits will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of semiconductor components, FIGS. 1A, 2A, and 3 are not to scale.

DETAILED DESCRIPTION

Figure 1A:
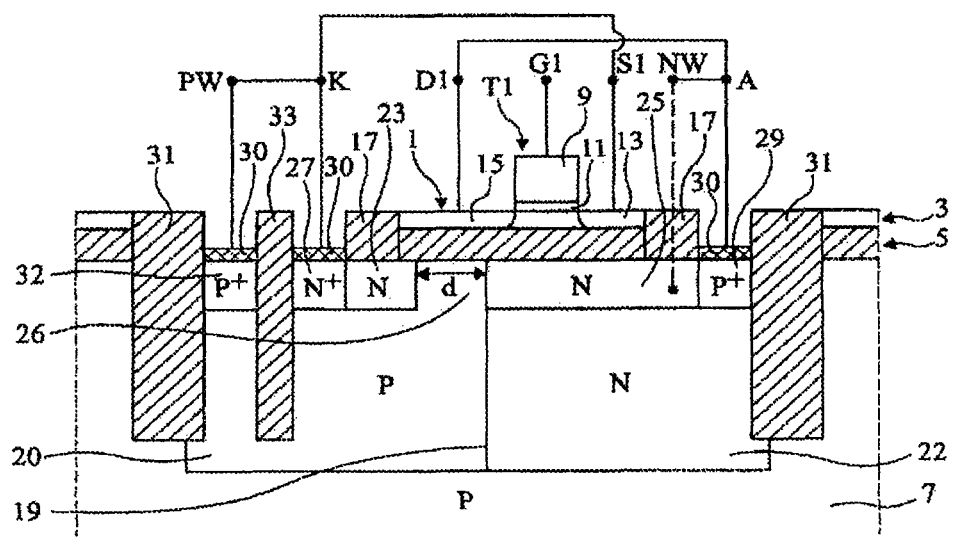
FIG. 1A is a cross-section view schematically showing a MOS transistor formed in an SOI-type layer protected against overvoltages.

FIG. 1A is a cross-section view schematically showing a MOS transistor formed in an SOI-type semiconductor layer protected against overvoltages.

A MOS transistor T1 is formed in an active area 1 of an SOI-type semiconductor layer 3, for example, made of single-crystal silicon, arranged on an insulating layer 5 currently called BOX ("Buried OXide"), for example, made of silicon oxide, itself arranged on a semiconductor substrate 7, for example, made of silicon. MOS transistor T1 comprises a conductive gate 9 extending on semiconductor layer 3 and insulated therefrom by a gate insulator 11. A source region 13 and a drain region 15 extend in semiconductor layer 3 on either side of gate 9. Active area 1 of semiconductor layer 3, having MOS transistor T1 formed therein, is surrounded with an insulation region 17, for example, made of silicon oxide, which extends from upper surface of layer 3 all the way to substrate 7.

As an example of dimensions, semiconductor layer 3 for example has a thickness ranging between 3 and 100 nm, for example, on the order of 10 nm, and insulating layer 5 for example has a thickness ranging between 5 and 30 nm, for example, on the order of 25 nm.

Respectively call S1, D1, and G1 the source, drain, and gate electrodes of MOS transistor T1.

To protect MOS transistor T1 against positive overvoltages that may occur between its drain D1 and its source S1 while it is not connected, a lateral NPNP$^+$ thyristor is formed in substrate 7, mainly under MOS transistor T1.

In the shown example, a P-type doped well 20 and an N-type doped well 22 are formed next to each other in the upper portion of substrate 7, which is for example very lightly P-type doped. Junction 19 between wells 20 and 22 is in front of drain region 15 of MOS transistor T1, on the side of gate 9. Starting from junction 19 between wells 20 and 22, well 20 extends under drain region 15 of MOS transistor T1 and beyond, and well 22 extends under the rest of MOS transistor T1 and beyond.

N-type doped regions 23 and 25, separated by a portion 26 of well 20 located in front of a portion of drain region 15 of MOS transistor T1, respectively extend at the surface of wells 20 and 22, under MOS transistor T1 and insulation region 17. Portion 26 of well 20 is separated from drain region 15 of MOS transistor T1 by insulating layer 5.

In the shown example, region 25 extends under a portion of MOS transistor T1, from junction 19 between wells 20 and 22, and under insulation region 17. Region 23 extends at a distance d from junction 19, under an end of drain region 15 of MOS transistor T1 located on the side opposite to gate 9, and under insulation region 17. As shown, the length of drain region 15 may be greater than that of source region 13 so that this drain region covers region 26 located between regions 23 and 25.

A contact region 27, more heavily N-type doped than region 23, extends at the surface of well 20, next to region 23 and in contact therewith. An anode region 29, heavily P-type doped, extends at the surface of well 22 next to region 25 and in contact therewith. Regions 27 and 29 may be covered with a metal silicide 30 and are accessible from the upper surface of the structure.

An insulation ring 31, for example, made of silicon oxide, extending from the upper surface of semiconductor layer 3 all the way into substrate 7, surrounds wells 20 and 22.

Terminals PW and NW are preferably provided to bias wells 20 and 22. An insulation region 33 is formed from the upper surface of semiconductor layer 3 all the way into well 20, next to contact region 27. Terminal PW for example corresponds to a region 32 of the surface of well 20, more heavily P-type doped than well 20, located between insulation regions 31 and 33. Region 32 may be covered with metal silicide 30 at the same time as regions 27 and 29. Terminal NW possibly similarly provided on well 22 is shown in dotted lines since it is not visible in the cross-section plane of FIG. 1A.

Regions 23, 26, 25, and 29 formed in substrate 7 partly under MOS transistor T1 form the different regions of a lateral protection thyristor. Region 23 forms the cathode region of the thyristor, portion 26 of well 20 forms the cathode gate region of the thyristor, region 25 forms the anode gate region of the thyristor, and region 29 forms the anode region of the thyristor. Cathode gate region 26 of the thyristor, located between regions 23 and 25, is located under drain region 15 of MOS transistor T1 and is separated therefrom by insulating layer 5.

Anode A and cathode K of the protection thyristor are respectively connected to drain D1 and to source S1 of MOS transistor T1.

Figure 1B:
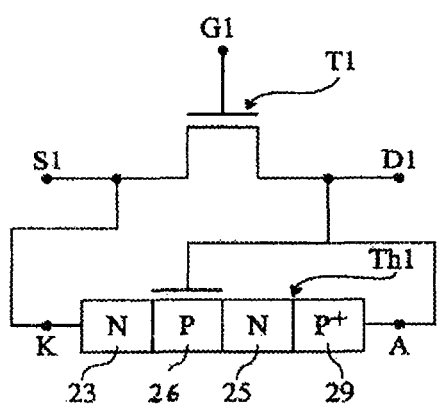
FIG. 1B is an electric circuit diagram corresponding to FIG. 1A.

FIG. 1B is an electric circuit diagram corresponding to the association illustrated in FIG. 1A of a MOS transistor formed in an SOI-type layer and of a field-effect turn-on thyristor Th1 of protection against overvoltages.

When a positive overvoltage occurs between drain D1 (anode A of the thyristor) and source S1 (cathode K of the thyristor) of MOS transistor T1 while it is not connected, as soon as the voltage of drain region 15 exceeds a given threshold, a conduction channel forms by field effect at the surface of turn-on region 26 of thyristor Th1. Thyristor Th1 turns on, which protects MOS transistor T1.

To properly set the turn-on threshold of protection thyristor Th1, terminals PW and NW are preferably respectively connected to cathode K and to anode A of the thyristor. Similarly, the thickness and the nature of insulating layer 5 are selected to set this turn-on threshold to a value only slightly greater than normal transistor operating voltages. For example, if the normal transistor operating voltage is on the order of 1.5 V, the thyristor turn-on threshold may be on the order of 3 V.

When a positive overvoltage occurs between source S1 and drain D1 of MOS transistor T1, junction 19 between wells 20 and 22 turns on, which protects MOS transistor T1.

MOS transistor T1 is protected in case of a positive or negative overvoltage between its drain and its source. In the case of a positive overvoltage, the thyristor protects the MOS transistor. In case of a negative overvoltage, the forward P-N junction between wells 20 and 22 protects the MOS transistor.

The different regions of the thyristor correspond to elements currently used in CMOS transistor and transistor-on-SOI manufacturing technologies. P-type well 20 and N-type well 22 respectively correspond to wells currently called PWell and NWell in the art. N-type doped regions 23 and 25 correspond to regions currently called N GP ("Ground Plane") in the art, which are currently used to form the so-called back gate of dual-gate MOS transistors on SOI.

Thus, these different regions will for example have the following usual doping levels:

for wells 20 and 22: between $10^{16}$ and $10^{17}$ atoms/cm$^3$;

for regions 23 and 25: between $10^{17}$ and $10^{19}$ atoms/cm$^3$; and for regions 27 and 29: between $10^{19}$ and $10^{21}$ atoms/cm$^3$.

An advantage of a device for protecting a MOS transistor against overvoltages of the type illustrated in FIGS. 1A and 1B is that it may be manufactured by using steps currently used in a method for manufacturing an integrated circuit chip comprising CMOS transistors.

Another advantage of such a device for protecting a MOS transistor against overvoltages is that the assembly takes up a surface only slightly greater than that taken up by the transistor alone, since the protection device is partly located under the MOS transistor.

Figure 2A:
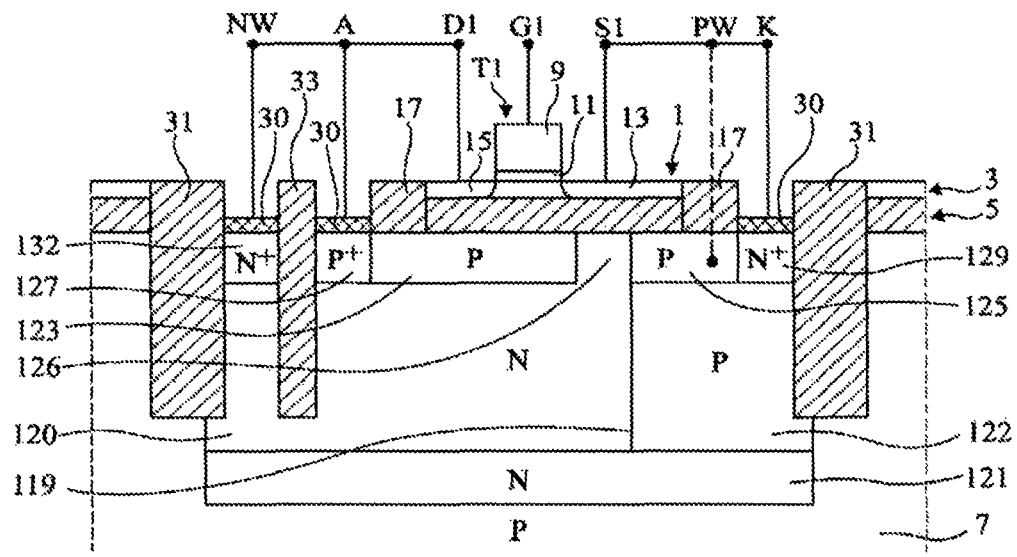
FIG. 2A is a cross-section view schematically showing a variation of a MOS transistor formed in an SOI-type layer protected against overvoltages.

FIG. 2A is a cross-section view schematically showing a variation of the device of FIGS. 1A and 1B. In this variation, all the conductivity types of the regions and wells forming the thyristor are inverted. Each region of inverted conductivity type bears the same reference numeral as the corresponding region of FIGS. 1A and 1B, preceded by 1.

In this variation, the field-effect control acts on the anode gate region of the thyristor and not on its cathode gate region.

Junction 119 between wells 120 and 122 is in front of source region 13 of MOS transistor T1.

In the shown example, region 125 extends under a portion of source region 13 of MOS transistor T1, from junction 119 between wells 120 and 122 under insulation region 17. Region 123 extends at a distance from junction 119, under an end of source region 13 of MOS transistor T1 located on the side of gate 9, under gate 9, under drain region 15, and under insulation region 17. As shown, the length of source region 13 may be greater than that of drain region 15 so that this source region covers region 126 located between regions 123 and 125.

Anode gate region 126 of the thyristor, located between regions 123 and 125, is located under source region 13 of MOS transistor T1 and is separated therefrom by insulating layer 5.

An N-type buried layer 121, extending at least under P-type well 122, is preferably provided to insulate well 122 from the rest of substrate 7.

Figure 2B:
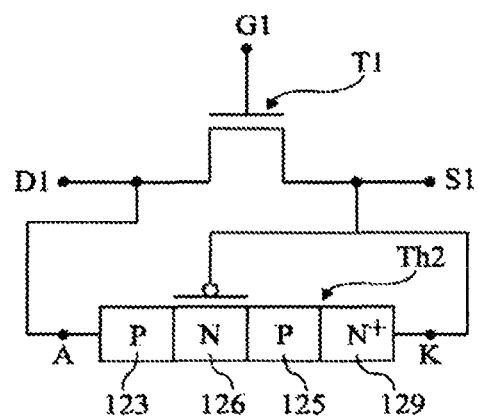
FIG. 2B is an electric circuit diagram corresponding to FIG. 2A.

FIG. 2B is an electric circuit diagram corresponding to the association illustrated in FIG. 2A of a MOS transistor formed in an SOI-type layer and of a field-effect turn-on thyristor Th2 of protection against overvoltages.

Anode A and cathode K of protection thyristor Th2 are respectively connected to drain D1 and to source S1 of MOS transistor T1.

When a positive overvoltage occurs between drain D1 (anode A of the thyristor) and source S1 (cathode K of the thyristor) of MOS transistor T1 while said transistor is not connected, as soon as the voltage of source region 13 exceeds a given threshold (in absolute value), a conduction channel forms by field effect at the surface of turn-on region 126 of thyristor Th2. Thyristor Th2 turns on, which protects MOS transistor T1.

Figure 3:
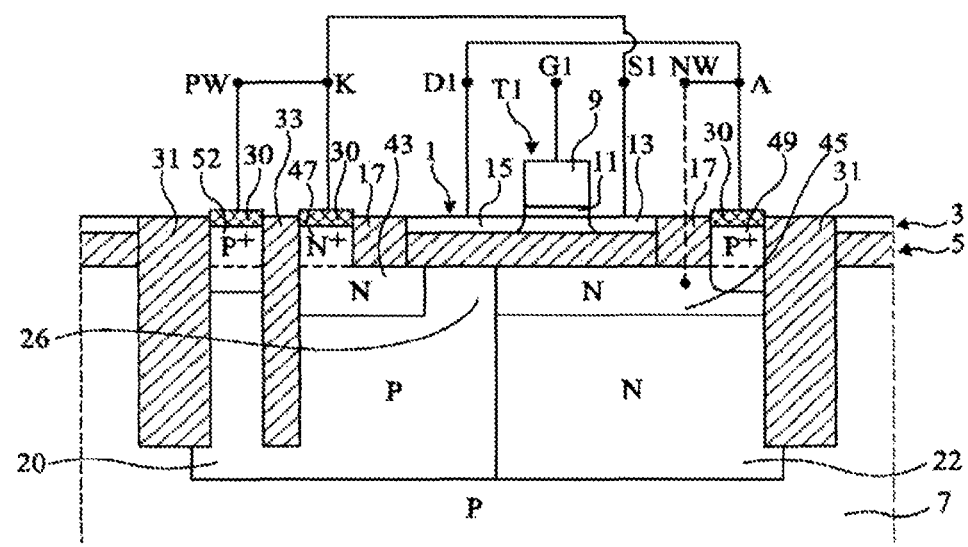
FIG. 3 is a cross-section view schematically showing another variation of a MOS transistor formed in an SOI-type layer protected against overvoltages.

FIG. 3 is a cross-section view schematically showing a variation of the device of FIG. 1A. The elements common with those of FIG. 1A are designated with the same reference numerals and will not be described again hereafter.

In this variation, N-type doped regions 43 and 45, corresponding to regions 23 and 25 of the protection thyristor illustrated in FIG. 1A, separated by a portion 26 of well 20 located in front of a portion of drain region 15 of MOS transistor T1, extend under MOS transistor T1 and insulation region 17, and beyond insulation region 17. Cathode contact region 47 and anode region 49 of the protection thyristor, respectively corresponding to cathode contact region 27 and to anode region 29 of the thyristor illustrated in FIG. 1A, are located partly above substrate 7, on either side of MOS transistor T1 surrounded with insulation region 17.

To form cathode contact region 47 and anode region 49 of the protection thyristor, layers 3 and 5 have been partially removed to reach the upper surface of substrate 7. The epitaxy has for example then been resumed from the upper surface of substrate 7 to the upper level of semiconductor layer 3.

In this variation, cathode contact region 47 extends above a portion of region 43 and is in contact therewith, next to insulation region 17. Anode region 49 extends above a portion of region 45 and is in contact therewith, next to insulation region 17.

In this variation, terminals PW and NW, which may be provided to bias wells 20 and 22, correspond to regions formed above wells 20 and 22. To form terminal PW, after partial removal of layers 3 and 5, a region 52, corresponding to region 32 of FIG. 1A, has for example been formed by resuming the epitaxy above substrate 7, at the same time as regions 47 and 49. Terminal NW is for example formed similarly.

The thyristor formed by regions 43, 26, 45, and 49 enables to protect MOS transistor T1 against positive overvoltages capable of occurring between its drain D1 and its source S1. To achieve this, drain D1 and source S1 of MOS transistor T1 are respectively connected to anode A and to cathode K of the thyristor.

Specific embodiments of the present invention have been described. Various alterations, modifications, and improvements will readily occur to those skilled in the art.

In particular, relating to the variation illustrated in FIG. 3 of a device for protecting a MOS transistor against overvoltages, the conductivity types of wells 20, 22, and of regions 43, 45, 26, 47, 49, and 52 may all be inverted.

In the case of a device of the type illustrated in FIG. 3, wells 20 and 22 may be omitted. In this case, field-effect turn-on region 26 of the protection thyristor corresponds to a portion of P-type substrate 7, located between N-type regions 43 and 45, located under at least a portion of drain region 15 of MOS transistor T1 and separated therefrom by insulating layer 5.

Relating to the device illustrated in FIG. 2A, substrate 7 may of course be of type N.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A MOS transistor device comprising:

a semiconductor substrate and insulating layer thereon and an SOI-type semiconductor layer on the insulating layer;

a MOS transistor comprising a gate electrode above the SOI-type semiconductor layer and source and drain regions in said SOI-type semiconductor layer on opposite sides of said gate electrode; and a lateral field-effect-controlled thyristor comprising a cathode contact region and anode contact region within the substrate at least partly under the MOS transistor, a field effect turn-on region of the thyristor extending under at least a portion of the gate electrode of the MOS transistor and being separated therefrom by said insulating layer, the anode contact region and the cathode contact region of the lateral field-effect controlled thyristor being respectively connected to the drain region and to the source region of the MOS transistor, wherein the lateral field-effect controlled thyristor turns on in case of a positive overvoltage between the drain and the source regions of the MOS transistor, and a first well of a first conductivity type and a second well of the second conductivity type extending next to each other in the substrate below the cathode contact region and anode contact region of the lateral field-effect-controlled thyristor and a junction between the first and second wells turns on when a positive overvoltage occurs between the source region and drain region of the MOS transistor.

2. The MOS transistor device of claim 1, wherein the field-effect turn-on region of the thyristor corresponds to its cathode contact region and extends under at least a portion of the drain region of the MOS transistor.

3. The MOS transistor device of claim 1, wherein the field-effect turn-on region of the thyristor corresponds to its anode contact region and extends under at least a portion of the source region of the MOS transistor.

4. The MOS transistor device of claim 1, comprising:
first and second regions of the second conductivity type respectively extending at the surface of the first and second wells, the first and second regions being separated from each other by a portion of the first well corresponding to the field-effect turn-on region of the thyristor.

5. The MOS transistor device of claim 4, wherein:
the first and second wells are respectively P-type doped and N-type doped;
the cathode contact region of the lateral field-effect controlled thyristor corresponds to a third N-type region more heavily doped than the first region, extending at the surface of the first well next to the first region and in contact therewith; and
the anode contact region of the thyristor corresponds to a fourth heavily-doped P-type region extending at the surface of the second well next to the second region and in contact therewith.

6. The MOS transistor device of claim 4, wherein:
the first and second wells are respectively P-type doped and N-type doped;
the cathode contact region of the lateral field-effect controlled thyristor corresponds to a third N-type region more heavily doped than the first region, extending above the first region and in contact therewith; and
the anode contact region of the lateral field-effect controlled thyristor corresponds to a fourth heavily-doped P-type region extending above the second region and in contact therewith.

7. The MOS transistor device of claim 4, wherein:
the substrate is P-type doped;
the first and second wells are respectively N-type doped and P-type doped;
the anode contact region of the lateral field-effect controlled thyristor corresponds to a third P-type region more heavily doped than the first region, extending at the surface of the first well next to the first region and in contact therewith;
the cathode contact region of the lateral field-effect controlled thyristor corresponds to a fourth heavily-doped N-type region extending at the surface of the second well next to the second region and in contact therewith and
an N-type buried layer extends at least under the second well.

8. The MOS transistor device of claim 5, wherein a first terminal connected to the first well is connected to the cathode contact region of the lateral field-effect controlled thyristor, and wherein a second terminal connected to the second well is connected to the anode contact region of the thyristor.

9. The MOS transistor device of claim 7, wherein a first terminal connected to the first well is connected to the anode contact region of the lateral field-effect controlled thyristor, and wherein a second terminal connected to the second well is connected to the cathode contact region of the lateral field-effect controlled thyristor.

10. The MOS transistor device of claim 1, wherein the thickness of the SOI-type semiconductor layer ranges between 3 and 100 nm and wherein the thickness of the insulating layer ranges between 5 and 30 nm.

* * * * *